United States Patent

Boswell et al.

Patent Number: 5,900,063
Date of Patent: May 4, 1999

[54] METHOD AND APPARATUS FOR COATING A SUBSTRATE

[75] Inventors: Roderick Boswell; Antoine Durandet, both of Canberra; David MacKenzie, Sydney, all of Australia

[73] Assignee: The Australian National University, Acton Canberra, Australia

[21] Appl. No.: 08/682,633

[22] PCT Filed: Feb. 2, 1995

[86] PCT No.: PCT/AU95/00047

§ 371 Date: Sep. 5, 1996

§ 102(e) Date: Sep. 5, 1996

[87] PCT Pub. No.: WO95/21276

PCT Pub. Date: Aug. 10, 1995

[30] Foreign Application Priority Data

Feb. 2, 1994 [AU] Australia .................................. PM3655

[51] Int. Cl.⁶ .................................................. C23C 14/00
[52] U.S. Cl. ................................ 118/723 VE; 204/298.41
[58] Field of Search ..................... 118/723 VE, 723 EB; 204/298.41, 298.16

[56] References Cited

U.S. PATENT DOCUMENTS

| | | |
|---|---|---|
| 4,683,838 | 8/1987 | Kimura et al. ...................... 118/726 X |
| 4,990,229 | 2/1991 | Campbell et al. .................. 118/723 IR |
| 5,126,030 | 6/1992 | Tamagaki et al. . | |

FOREIGN PATENT DOCUMENTS

| | | |
|---|---|---|
| 56-35768 | 4/1981 | Japan . |
| 62-77465 | 4/1987 | Japan . |
| 62-235484 | 10/1987 | Japan . |
| 63-62872 | 3/1988 | Japan . |
| 4-365853 | 12/1992 | Japan . |
| WO 89/06708 | 7/1989 | WIPO . |
| WO 91/17225 | 11/1991 | WIPO . |
| WO 92/16959 | 10/1992 | WIPO . |
| WO 93/14239 | 7/1993 | WIPO . |

*Primary Examiner*—Thi Dang
*Attorney, Agent, or Firm*—Townsend & Townsend & Crew; Guy W. Chambers

[57] ABSTRACT

A method and apparatus for forming a coating on a substrate. The system (1) comprises an electron-beam evaporator (5) to produce an evaporant (6) from a source material, a plasma generation chamber (3), within which a magnetoplasma is generated, and a magnetic field supply means (10) to apply a magnetic field (11) to the apparatus (1), to transport the magnetoplasma (60) to the substrate (12).

18 Claims, 4 Drawing Sheets

METHOD AND APPARATUS FOR COATING A SUBSTRATE

FIELD OF THE INVENTION

The present invention relates to a method and apparatus for coating a substrate, and in particular, to a method and apparatus which creates a magnetoplasma in the vicinity of an evaporated source material to assist the transport of an evaporant and/or ions of a background gas under the influence of an applied magnetic field for deposition on a substrate material.

DESCRIPTION OF THE PRIOR ART

The transporting of plasma by means of a magnetic field is well known in the literature, and is commonly used for forming thin film coatings in the case where the source of material is a cathodic arc (Aksenov et al, Soviet Journal of Plasma Physics 4 (1978), page 425).

The transportation of plasma by magnetic fields has also been described, in U.S. Pat. No. 4,810,935, entitled 'Method and apparatus for producing large volume magnetoplasmas' by R W Boswell. In this case no source of evaporation was discussed, but rather the plasma was created in gases admitted to the process.

The use of a thermal evaporation source with a plasma in its vicinity is also well known as the 'ion plating' process. That known process differs from the present invention by its use of electric fields only to transport the plasma to the substrate rather, than a magnetic field and an electric field, as in the invention.

The use of energetic ions to densify a film is also well known as Ion Assisted Deposition. That known process differs from the present invention by its use of a source of bombarding ions (plasma or ion source) not transported by a magnetic field and separate from the source of deposited material.

SUMMARY OF THE INVENTION

The present invention seeks to provide a method and apparatus for forming a coating on a substrate, which differs from those prior art methods and apparatus hereinbefore discussed.

The present invention also seeks to provide a method and apparatus for forming a coating on a substrate which has a wide variety of applications therefor, such as producing "doped" films or alloys of various materials, for example, semiconductor materials.

In one broad form, the present invention provides an apparatus for forming a coating on a substrate, comprising:
 an electron-beam evaporator to produce an evaporant from a source material;
 a plasma generation chamber, within which a magnetoplasma is generated from the said evaporant and (most usually) also from a background gas; and,
 magnetic field supply means to apply a magnetic field to said apparatus, to transport said magnetoplasma to said substrate.

Preferably, said plasma generation chamber is supplied intermediate said evaporator and said substrate.

Preferably, the antenna is excited with radio frequency power, which is preferably in the frequency range 10 to 30 MHz.

Also preferably, each of said evaporator, said plasma generation chamber and said substrate are substantially axially concentric.

Most preferably, said plasma generation chamber is situated above said evaporator and below said substrate in a substantially vertical configuration.

In the preferred embodiment, said magnetic field acts to increase the density of said magnetoplasma and to increase the ionisation proportion of said evaporant and any background gases admitted to the chamber.

In another preferred embodiment the ionisation proportion of said evaporant is low or zero, and in the primary effect of the magnetic field is to transport ions of the said background gas to the surface to carry out the process of ion assisted deposition.

In another preferred embodiment the background gas contains precursors enabling the deposition of a doped film onto said substrate which originates from the background gas, while the dopant originates from the evaporant.

Most preferably, said evaporator is comprised of a crucible possibly having more than one compartment therein, each compartment housing a different source material, and whereby said evaporator is controlled to produce evaporant (s) from each source material, as desired.

In a preferred form, a bias voltage (DC or RF) is applied to said substrate.

Perhaps most preferably, said bias voltage is up to about 4 kV.

Preferably said substrate is heated or cooled.

In a most preferred form, a potential maximum in the plasma is located near to the evaporator such that said evaporant is largely ionised at a position at or above the potential maximum.

Perhaps most preferably, said magnetoplasma has an ion density greater than $10^{11}$/cc.

Preferably, said source material(s) is/are selected from boron, titanium. zirconium, carbon, hafnium, tungsten, silicon, germanium, chromium, tantalum, vanadium, magnesium, aluminium, manganese, nickel, copper, niobium, molybdenum, silver, indium, tin, yttrium, gold, any rare earth metal, gallium, calcium, strontium and barium.

Also preferably, said magnetoplasma is selected from the gases of argon, nitrogen, oxygen, hydrogen, methane, acetylene, phosphine, diborane, arsine, germane, silane, silicon tetrachloride, krypton, fluorine, trimethylgallium, aluminiumtrichloride, titaniumtetrachloride, teos and disilane.

Perhaps most preferably, said source material is boron and said magnetoplasma is comprised of a mixture of nitrogen and argon, such that said coating formed on said substrate comprises cubic boron nitride.

Perhaps most preferably, said source material is silicon and said magnetoplasma contains oxygen and/or nitrogen, such that said coating formed on said substrate comprises silicon dioxide or silicon nitride or a mixture of these.

Perhaps most preferably, said source material is germanium and said magnetoplasma comprises a mixture of silane and possibly oxygen, such that said coating formed on said substrate comprises germanium doped silicon or silicon dioxide.

BRIEF DESCRIPTION OF THE DRAWINGS

The present invention will become more fully understood from the following detailed description of the preferred but non-limiting embodiment thereof, described in connection with the accompanying drawings, wherein.

DETAILED DESCRIPTION OF PREFERRED EMBODIMENTS

Throughout the drawings, like numerals will be utilised to represent similar features, except where expressly otherwise indicated.

Figure 1:
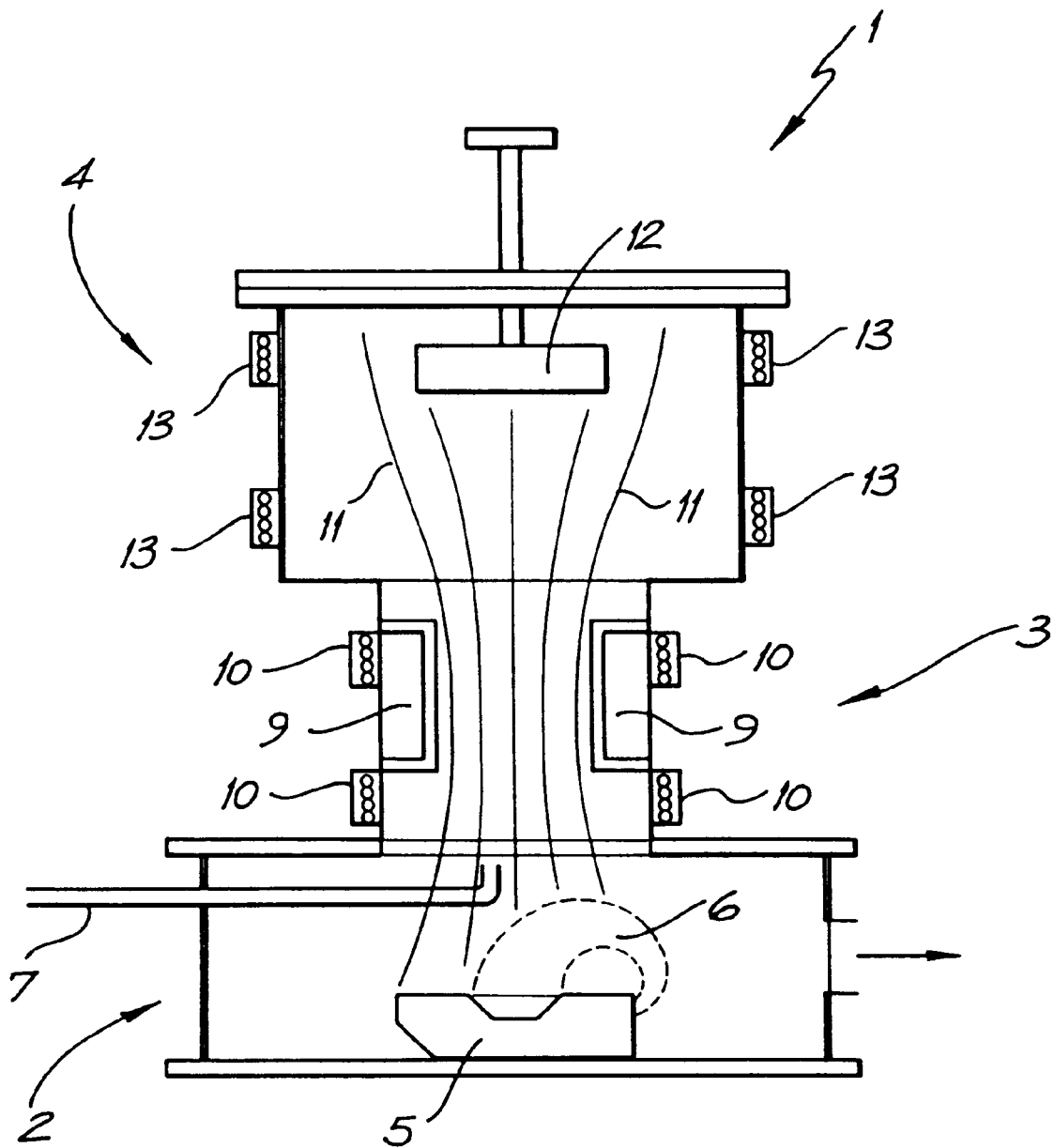
FIG. 1 shows an schematic representation of the key components of an apparatus in accordance with the present invention.
Figure 2:
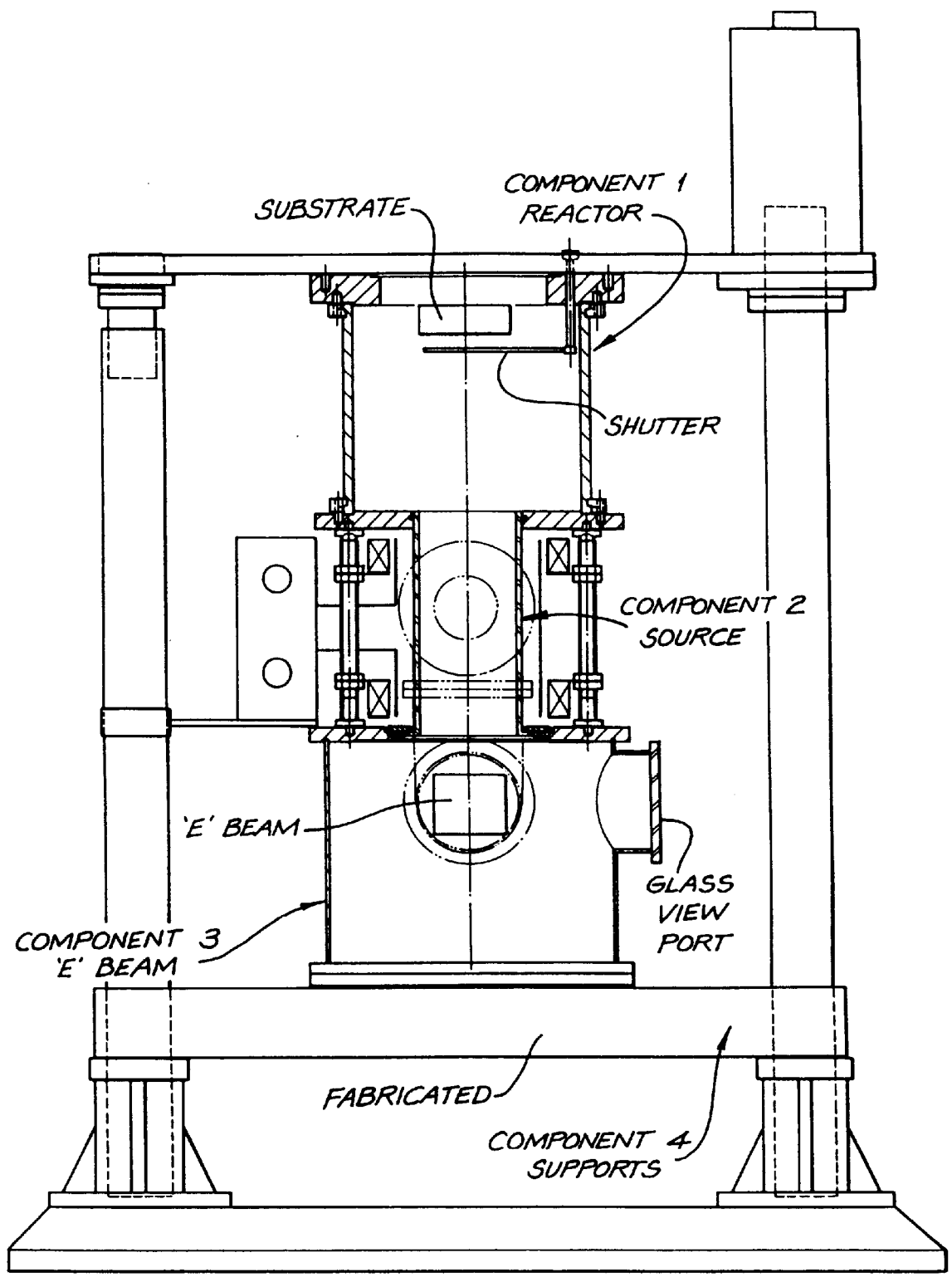
FIG. 2 details more precisely an actual embodiment of the apparatus.
Figure 3:
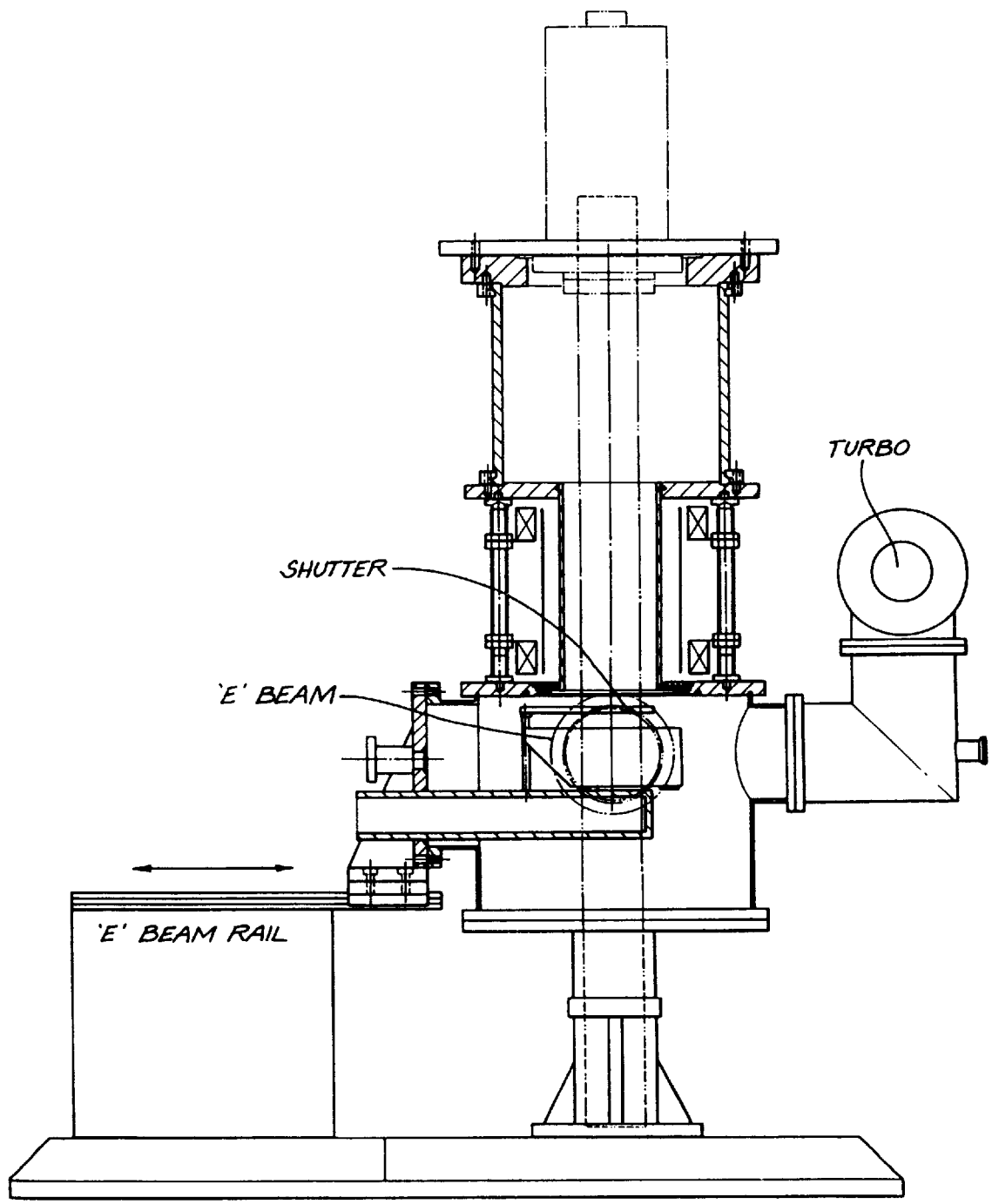
FIG. 3 shows a detailed view of the side of the apparatus shown in FIG. 2.
Figure 4:
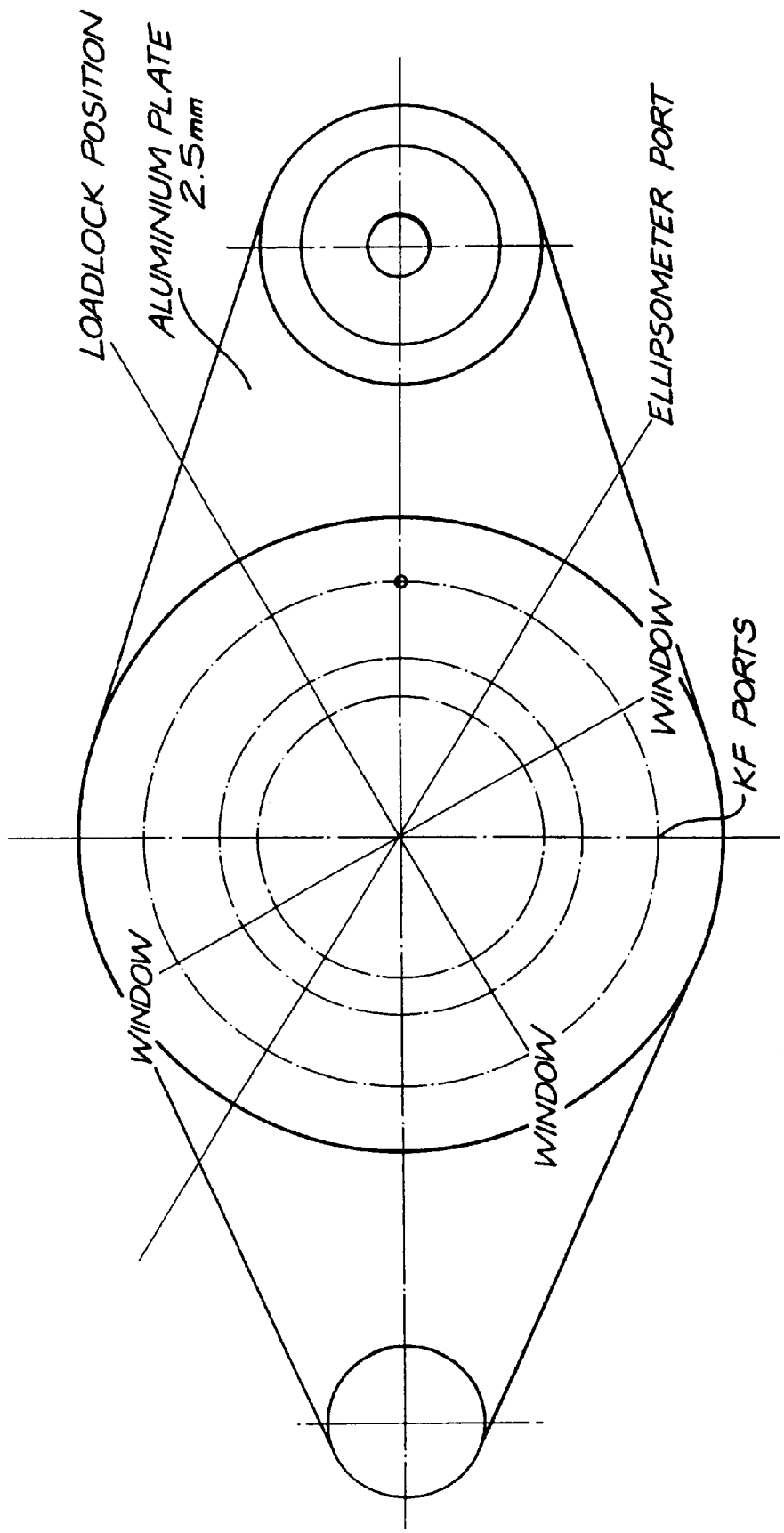
FIG. 4 shows a detailed view of the top of the apparatus shown in FIGS. 2 and 3.

The apparatus shown in the drawings, and as perhaps best illustrated in FIG. 1, and generally designated by the numeral 1, is comprised three core interconnected components, an evaporant producing area 2, a plasma generation chamber 3, and a deposition chamber 4. The evaporant chamber 2 basically comprises an electron beam evaporator 5, in which an electron beam is directed at a quantity of source material held in a crucible to produce an evaporant 6 from the source material.

The plasma generation chamber 3 comprises a gas inlet 7 to supply gas thereinto, and an antenna 9 for launching helicon waves. A magnetic field is sustained by field coils 10 which provide a magnetic field shown by field lines 11 which are essentially vertical and extend towards either end of the apparatus 1. The plasma is sustained by radiofrequency inductive excitation. A suitable design for the plasma source consists of a cylindrical silica tube to which an external antenna is attached of a type normally used for launching of helicon waves.

In the deposition chamber 4, a substrate which is to be coated 12, is located some distance above the plasma source and facing downwards. Field coils 13 assist the field coils 10 within the plasma generation chamber 3 to produce the magnetic field as shown by field lines 11. The substrate 12 may be biased with DC or RF potentials and heated or cooled to an appropriate temperature.

An important feature of the invention is that the maximum plasma potential in the plasma is located a distance above the evaporation source 5, which is sufficiently small that ions of evaporant 6 and/or background gases are largely polarised at or above the potential maximum. This is achieved by controlling/adjusting the pressure, plasma density, and magnetic field intensities to optimum values.

The conditions of the process which we have observed to lead to the formation of the cubic phase of boron nitride, c-BN, are listed in Table I, as follows:

TABLE I

| Conditions leading to c-BN formation | |
|---|---|
| Electrical input to electron beam evaporator | 140 mA at 8 kV |
| Power delivered to plasma source | 300 W |
| Distance from boron source to bottom of plasma source | 70 mm |
| Length of plasma source | 300 mm |
| Internal diameter of plasma source | 130 mm |
| Distance from boron source to substrate | 600 mm |
| rf voltage peak to peak applied to substrate | 1400 V |
| dc bias | −360 V |
| Substrate temperature | 260° C. |
| Argon flow rate | 3 sccm |
| Nitrogen flow rate | 5 sccm |
| Total pressure | 0.5 m Torr |
| Substrate material | silicon |
| Current in field coils | |
| (top of helicon source) (field up) | 0.2A |

TABLE I-continued

| Conditions leading to c-BN formation | |
|---|---|
| (bottom of helicon source) (field down) | 1A |
| Average diameter of field coils | 195 mm |
| Number of turns | 250 |
| Coil centre to centre spacing | 210 mm |

The conditions of the process which have been observed to lead to the formation of silicon dioxide are listed in table 2 as follows:

TABLE II

| conditions leading to the formation of silicon dioxide | |
|---|---|
| Electrical input to the electron beam evaporator | 300 mA at 10 kV |
| Power delivered to the plasma source | 800 W |
| Distance from silicon source to bottom of plasma source | 70 mm |
| Length of plasma source | 150 mm |
| Internal diameter of plasma source | 130 mm |
| Distance from silicon source to substrate | 360 mm |
| Substrate temperature | <200 C. |
| Substrate dc bias | 0 to −200 V |
| Oxygen flow rate | 25 sccm |
| Total pressure | 2 m Torr |
| Substrate material | silicon |
| Current in fields coils | |
| (top of helicon source) | 0.2A |
| (bottom of helicon source) | 1A |
| Average diameter of field coils | 195 mm |
| Number of turns | 250 |
| Coil center to centre spacing | 100 mm |

To ionise some of the evaporant from the electron beam source and also to ionise any background gases present. The positive ions and electrons produced by the ionisation process are then transported to the vicinity of the substrate. A radiofrequency potential is applied to the substrate to alternatively attract the positive ions and the electrons.

The impact of the positive ions is used to produce desirable improvements in the properties of deposited films, and the impact of the electrons is used to neutralise any charges produced in the film by the positive ions.

Impact by positive ions may produce forms of materials which have useful properties by increasing their density as a result of the compaction effect of the ions. This process is known in the prior art as 'ion assisted deposition'. An example of the use of this apparatus to achieve such a form of material, namely the cubic form of boron nitride, is provided as follows. Pure boron is used as a source of boron vapour in the electron beam evaporator. A mixture of argon and nitrogen gases is admitted to the apparatus. A selection of other materials may be chosen from the following non-exhaustive list.

| Source Material | Background Gas |
|---|---|
| Boron | Argon |
| Titanium | Nitrogen |
| Zirconium | Oxygen |
| Carbon | Hydrogen |
| Hafnium | Phosphine |
| Tungsten | Diborane |
| Chromium | Methane, acetylene |
| Silicon | Arsine |
| Germanium | Germane |

| Source Material | Background Gas |
| --- | --- |
| Chromium | Silane |
| Tantalum | Silicon Tetrachloride |
| Vanadium | Krypton |
| Magnesium | Fluorine |
| Aluminium | Trimethylgallium |
| Manganese | Aluminiumtrichloride |
| Nickel | Titaniumtetrachloride |
| Copper | Teos |
| Niobium | Disilane |
| Molybdenum | |
| Silver | |
| Indium | |
| Tin | |
| Yttrium | |
| Gold | |
| any rare earth metal | |
| Gallium | |
| Calcium | |
| Strontium | |
| Barium | |

Whilst particular embodiments of the present invention have been hereinbefore described, it will be appreciated that numerous variations and modifications will become apparent to the apparatus and method. It will also be appreciated that the apparatus and method may be utilised to form a wide variety of coatings of different characteristics on substrate materials. All such variations and modifications to the apparatus and method, and also to the applications for use of the apparatus and method including the different coatings provided thereby should be considered to fall within the scope of the invention as broadly hereinbefore described and as hereinafter claimed.

We claim:

1. An apparatus for forming a coating on a substrate, comprising:
    a substrate;
    an electrically independent evaporator situated below said substrate to produce an evaporant from a solid source material;
    a plasma generation chamber having an excitation antenna, within which a high density magnetoplasma is generated from at least said evaporant in order to apply a coating on said substrate, said plasma generation chamber being situated above said evaporator and below said substrate in a substantially vertical and axially concentric configuration, and,
    magnetic field supply means to apply a substantially vertically oriented magnetic field to said apparatus, to control the density of said magnetoplasma adjacent to said substrate.

2. An apparatus as claimed in claim 1, wherein said magnetoplasma is also generated from a background gas.

3. An apparatus as claimed in claim 1, wherein said excitation antenna is excited with radio frequency power in the frequency range 1 to 30 MHz.

4. An apparatus as claimed in claim 2, wherein said magnetic field acts to increase the density of said magnetoplasma and to increase the ionisation proportion of said evaporant and background gases admitted to the chamber.

5. An apparatus as claimed in claim 4 wherein the ionisation proportion of said evaporant is low, and the primary effect of the magnetic field is to transport ions of said background gas to the surface to carry out the process of ion assisted deposition.

6. An apparatus as claimed in claim 2, wherein said background gas contains precursors enabling the deposition of a doped film from said evaporant onto said substrate.

7. An apparatus as claimed in claim 1, wherein said evaporator is further comprised of a crucible having more than one compartment, each said compartment housing a different source material.

8. An apparatus as claimed in claim 1, wherein a bias voltage is applied to said substrate.

9. An apparatus as claimed in claim 8 wherein said bias voltage is about 4 kV.

10. An apparatus as claimed in claim 1, wherein said substrate is heated or cooled.

11. An apparatus as claimed in claim 1, wherein a potential maximum in the plasma is located near to said evaporator such that said evaporant is largely ionised at a position at or above the potential maximum.

12. An apparatus as claimed in claim 1, wherein said magnetoplasma has an ion density greater than $10^{11}$/cc.

13. An apparatus as claimed in claim 1, wherein said source material is selected from boron, titanium, zirconium, carbon, hafnium, tungsten, silicon, germanium, chromium, tantalum, vanadium, magnesium, aluminum, manganese, nickel, copper, niobium, molybdenum, silver, indium, tin, yttrium, gold, any rare earth metal, gallium, calcium, strontium and barium.

14. An apparatus as claimed in claim 2, wherein said background gas is selected from the gases of argon, nitrogen, oxygen, hydrogen, methane, acetylene, phosphine, diborane, arsine, germane, silane, silicon tetrachloride, krypton, fluorine, trimethylgallium, aluminumtrichloride, titaniumtectrachloride, teos and disilane.

15. An apparatus as claimed in claim 2, wherein said source material is boron and said background gas is comprised of a mixture of nitrogen and argon, such that said coating formed on said substrate comprises cubic boron nitride.

16. An apparatus as claimed in claim 2, wherein said source material is silicon and said background gas is oxygen, such that said coating formed on said substrate comprises silicon dioxide.

17. An apparatus as claimed in claim 2, wherein said source material is germanium and said background gas comprises a mixture of silane and oxygen, such that said coating formed on said substrate comprises germanium doped silicon dioxide.

18. An apparatus as claimed in claim 1 wherein said electrically independent evaporator is an electron beam evaporator.

* * * * *